US005493299A

United States Patent [19]

Song et al.

[11] Patent Number: 5,493,299

[45] Date of Patent: Feb. 20, 1996

[54] DIGITAL/ANALOG CONVERSION APPARATUS HAVING COLOR PALETTE RAM FOR MULTIMEDIA

[75] Inventors: Jae H. Song; Oh B. Kwon; Min H. Kim; Kwon H. Cha; Jeong S. Hyun, all of Ichonkun, Rep. of Korea

[73] Assignee: Hyundai Electronics Industries Co., Ltd., Kyoungkido, Rep. of Korea

[21] Appl. No.: 144,567

[22] Filed: Nov. 2, 1993

[30] Foreign Application Priority Data

Nov. 2, 1992 [KR] Rep. of Korea .................. 1992-20421

[51] Int. Cl.$^{6}$ ........................ H03M 1/66

[52] U.S. Cl. ........................ 341/141; 395/153; 345/115

[58] Field of Search ........................ 341/141, 144; 395/153, 154; 345/115, 116

[56] References Cited

U.S. PATENT DOCUMENTS 4,942,391 7/1990 Kikuta ........................ 345/115
5,250,933 10/1993 Beaudin et al. ........................ 345/115

*Primary Examiner*—Howard L. Williams

*Attorney, Agent, or Firm*—Spencer & Frank

[57] ABSTRACT

A digital/analog conversion apparatus with a color palette RAM for a multimedia, comprising a first latch circuit for inputting a pixel address signal, a pixel mask register for selectively masking the pixel address signal from the first latch circuit in response to a control signal from a microprocessor interface circuit, a second latch circuit for storing digital color information temporarily, and first to third digital/analog converters for converting the digital color information from the second latch circuit into analog R, G and B color information. The palette RAM stores digital color information from the microprocessor interface circuit and outputs the digital color information stored in its location corresponding to the pixel address signal from the pixel mask register to the second latch circuit. The apparatus also comprises first to third switching circuits for inputting the digital color information from the color palette RAM, digital video color information from an external video medium and external digital color information from a pixel address signal input line and selectively outputting the inputted information in response to external first to third control signals, and a third latch circuit for transferring the output information from the second switching circuit to a digital color information output terminal.

20 Claims, 7 Drawing Sheets

DIGITAL/ANALOG CONVERSION APPARATUS HAVING COLOR PALETTE RAM FOR MULTIMEDIA

BACKGROUND OF THE INVENTION

1. Field of the Invention

The present invention relates in general to a digital/analog conversion apparatus having a color palette random access memory (RAM), referred to hereinafter as a palette DAC apparatus, and more particularly to a palette DAC apparatus for multimedia which is capable of inputting color information from two information supply sources, performing a switching operation for the inputted color information to select one of them and outputting the selected color information in the form of digital information as well as analog information.

2. Description of the Prior Art

Recently, techniques in a multimedia field have rapidly been developed to process information more effectively and transfer the processed information innovationally. According to such a trend, in the multimedia field, a technical requirement comes to the fore for the purpose of expressing video color information from a plurality of information supply sources such as, for example, a television (TV), a video cassette recorder (VCR) or a video tape recorder (VTR), a video camera, a compact disk (CD) and the like simultaneously with a video graphics array (VGA) color information of a personal computer (PC) on a single screen.

Conventional techniques for meeting such a technical requirement will hereinafter be described with reference to FIGS. 1 to 4.

Referring to FIG. 1, there is shown a block diagram of a conventional palette DAC apparatus. As shown in this drawing, the conventional palette DAC apparatus comprises latch circuits 1 and 4, a pixel mask register 2, a color palette RAM. 3, digital/analog (D/A) converters (referred to hereinafter as DACs) 5–7, and a microprocessor interface circuit 8. The DACs 5–7 are adapted to output analog red (R), green (G) and blue (B) signals, respectively.

The conventional palette DAC apparatus as shown in FIG. 1 constitutes one of important parts being now used in a VGA card and is well-known as a commercially available single IC chip.

Basically, a finite number of color values are mainly used to constitute a picture on a screen. The finite number of color values are stored into the color palette RAM 3 for a predetermined time period through the microprocessor interface circuit 8 under a control of a microprocessor (not shown) which is provided at the outside of the palette DAC apparatus. The color values are read from the color palette RAM 3 and then outputted through the microprocessor interface circuit 8 to the outside of the palette DAC apparatus, as needed. In this process, the color values in the color palette RAM 3 may be corrected at any time as needed.

A pixel address signal from a display control circuit (not shown) is applied to the palette DAC apparatus for the display of a color picture on the screen. The pixel address signal from the display control circuit addresses a corresponding location of the color palette RAM 3 through the latch circuit 1 and the pixel mask register 2. As addressed, digital color information or the color value from the corresponding location of the color palette RAM 3 is transferred to the three DACs 5–7 through the latch circuit 4. Then, the three DACs 5–7 convert the digital color information into analog color information and output the analog color information to the outside of the palette DAC apparatus.

In this case, an analog color value to be outputted to the outside of the palette DAC apparatus was recorded as a digital color value in a location of the color palette RAM 3 which is recognized by a software operating system or the user. Therefore, for the display, the pixel address signal from the display control circuit is applied to the palette DAC apparatus to address the corresponding location of the color palette RAM 3 in which the digital color value to be displayed was stored. As a result, the digital color value or information from the addressed location of the color palette RAM 3 is transferred to the three DACs 5–7 through the latch circuit 4. Then, the three DACs 5–7 convert the digital color information into three, red, green and blue analog color information and output the analog color information to the outside of the palette DAC apparatus.

The red, green and blue color output values may be expressed by electrical analog numerical values which are specified by an international standard and are directly applied to a cathode ray tube (CRT) for displaying the color information thereon.

The use of the color palette RAM 3 in the above manner is based on a characteristic that colors constituting one frame are not large in number, and has the effect of reducing a size of a video memory which stores video information in the unit of frame therein and is provided at the outside of the palette DAC apparatus. Namely, the video memory may store the red, green and blue color information themselves to express one frame directly as the red, green and blue color information. In this case, the size of the video memory is greater than that in the case of expressing one frame indirectly by storing the color values in the color palette RAM 3 and addressing the corresponding locations of the color palette RAM 3. In the case of expressing one frame indirectly, the size of the video memory can be reduced at a ratio of storing addresses of the color palette RAM 3 to the maximum number with respect to the case of expressing one frame directly.

By the way, in the multimedia field, video signals from original video equipments such as the TV, the VCR (VTR), the video camera, the CD and the like can be viewed on a screen of the PC together with information from the PC, which is regarded as one of functions of the PC. On the contrary, the information from the PC can be viewed on screens of the video equipments together with the video information from the video equipments in a video information processing manner. In such a function, it is preferred to process the signal information in a digital form in order to re-process or store the color information in various forms.

FIGS. 2 to 4 are block diagrams illustrating examples of conventional display circuits using the palette DAC apparatus in FIG. 1, which are capable of performing the above-mentioned function in the multimedia field. Namely, in the conventional display circuits in FIGS. 2 to 4, video color signals from the video media such as the TV, the VCR (VTR), the video camera, the CD and the like can be displayed on a single screen simultaneously with a color signal which is generated from the palette DAC apparatus in response to a pixel address signal from a VGA circuit in the PC.

In FIGS. 2 to 4, the reference numeral 10 designates the palette DAC apparatus in FIG. 1, the reference numeral 11 designates an analog switching circuit, the reference numeral 12 designates a digital/analog (D/A) converter, the reference numeral 13 designates an analog/digital (A/D) converter, and the reference numeral 14 designates a digital switching circuit.

In FIG. 2, the analog switching circuit 11 is adapted to select one of the analog color signal from the palette DAC apparatus 10 and the analog video color signal inputted directly therein. It should be noted that an output value from the analog switching circuit 11 is color information (R, G and B) of a pixel which is a basic unit element of a picture on the screen. Therefore, a switching operation of the analog switching circuit 11 may be performed so that the video color signal from one of the video media such as the TV, the VCR (VTR), the video camera, the CD and the like can be displayed on one area of the screen and the color signal from the palette DAC apparatus 10 corresponding to the pixel address signal from the VGA circuit in the PC can be displayed on the other area of the screen. That is, two types of color information can be displayed simultaneously on the single screen.

In this case, each of the color signal information or analog R, G and B color signal values to the CRT has a peak amplitude value of 714 mV or 1.0 V which is specified by the international standard, and a resolution which is determined according to the number of bits for the process of the color signal information in the digital form. In other words, an analog color amplitude is divided in equal parts of the number which is obtained by taking the number of the bits as an exponent for 2. For example, the analog color amplitude is divided in 64 equal parts if the number of the bits is 6 and in 256 equal parts if the number of the bits is 8.

On the other hand, in FIG. 2, the switching operation of the analog switching circuit 11 is performed under an analog condition, resulting in generation of a noise. The generation of the noise resulting from the switching operation exerts a bad influence on the final analog color signal information or the output value from the analog switching circuit 11. Namely, the generation of the noise resulting from the switching operation may result in a degradation in the resolution since a minimum amplitude value of the analog color signal which is determined according to the number of the bits used is very small.

Also in the multimedia field, for the convenience of the user, there is provided a function of controlling freely a size of a window of the screen in which the video signal is expressed. In order to control freely the size of the window of the screen, it is preferred to process the video color signal in the digital form. Only in the case where the video color signal from the video medium to be expressed on the screen is stored in the digital form in a memory, it can be outputted from memory locations corresponding to a positive number multiple of an initial address or from the same memory location addressed by the positive number multiple times so that it can readily be adaptive to the size of the window of the screen.

This means that the video color signal from the video medium must be in the digital form before reaching the analog switching circuit 11. Namely, the resolution of the video color signal from the video medium can be controlled suitably for the size of the window of the screen by using an interpixel interpolation method or deleting adjacent pixel information according to a requirement of the user. In this case, the process can readily be performed only when the video color signal from the video medium is in the digital form. For this reason, the conventional construction in FIG. 2 has a disadvantage in that it is difficult to control the resolution of the video color signal from the video medium suitably for the size of the window of the screen.

In FIGS. 3 and 4, digital video color signal information from the video medium and the analog color signal information from the palette DAC apparatus 10 are processed at the outside of the palette DAC apparatus 10 in such a manner that they are selectively applied to the CRT.

In FIG. 3, the digital/analog converter 12 is adapted to convert the digital video color signal from the video medium into an analog color signal. Similarly to that in FIG. 2, the analog switching circuit 11 selects one of the analog color signal from the digital/analog converter 12 and the analog color signal which is generated from the palette DAC apparatus 10 in response to the pixel address signal from the VGA circuit in the PC. As a result of the switching operation of the analog switching circuit 11 at the interval as mentioned above, two types of color information can be displayed simultaneously on the single screen However, similarly to that in FIG. 2, the conventional construction in FIG. 3 has a disadvantage in that the generation of the noise resulting from the switching operation of the analog switching circuit 11 exerts the bad influence on the analog R, G and B color signal from the analog switching circuit 11.

In FIG. 4, the analog/digital converter 13 is adapted to convert the analog R, G and B color signal which is generated from the palette DAC apparatus 10 in response to the pixel address signal from the VGA circuit in the PC into a digital color signal. The digital switching circuit 14 is adapted to select one of the digital video color signal from the video medium and the digital color signal from the analog/digital converter 13. The use of the digital switching circuit 14 makes it possible to display two types of color information simultaneously on the single screen, in the same manner as that of the analog switching circuit 11. The output of the digital switching circuit 14 is converted by the digital/analog converter 12 into an analog color signal to be displayed on the screen of the CRT.

The analog/digital converter 13 must have a resolution higher than that of the analog signal from the palette DAC apparatus 10 because the analog signal is relatively sensitive to the noise as compared with the digital signal. In the case where the color signal to be displayed on the screen is intended to be recognized as a successively moved video, there is required an operating speed which is in proportion to a value obtained by multiplying the number of frames per a second by the number of pixels constituting one frame. For this reason, in some cases, there may be required high speed-convertible analog/digital converter and digital/analog converter. However, it is common that the analog/digital converter has a conversion speed lower than that of the digital/analog converter because of its internal circuitry. As a result, the operating speed of the entire circuit is limited to the conversion speed of the analog/digital converter.

SUMMARY OF THE INVENTION

Therefore, the present invention has been made in view of the above problems, and it is an object of the present invention to provide a palette DAC apparatus for multimedia which is capable of inputting color information from two information supply sources, performing a switching operation for the inputted color information to select one of them and outputting the selected color information in the form of digital information as well as analog information, so that unnecessary, additional circuitry and information processing operation in the prior art can be removed and the re-use of stored information can be performed variously, In accordance with the present invention, the above and other objects can be accomplished by a provision of a digital/analog conversion apparatus with a color palette RAM for a multimedia, comprising first latch means for inputting a pixel address signal from a display control circuit, microprocessor interface means for transferring digital color information from an external microprocessor to said color palette RAM and vice versa and transferring address and control signals from said microprocessor, a pixel mask register for selectively masking the pixel address signal from said first latch means in response to the control signal from said microprocessor interface means, said color palette RAM. for storing the digital color information from said microprocessor interface means in its location corresponding to the address signal from said microprocessor interface means and outputting the digital color information stored in its location corresponding to the pixel address signal from said pixel mask register, second latch means for storing the digital color information from said color palette RAM or different digital color information temporarily, and first to third digital/analog conversion means for converting the digital color information from said second latch means into analog R, G and B color information, wherein the improvement comprises first switching means for inputting the digital color information from said color palette RAM at its one input terminal and digital video color information which is directly applied from an external video medium through an independent input terminal of the apparatus at its other input terminal, selecting one of the inputted information in response to an external first control signal and outputting the selected information to said second latch means.

Also, the apparatus comprises second switching means for inputting the digital color information from said color palette RAM at its one input terminal and the output digital color information from said first switching means at its other input terminal, selecting one of the inputted information in response to an external second control signal and outputting the selected information; and third latch means for inputting the output digital color information from said second switching means and outputting the inputted digital information to a digital color information output terminal.

Further, the apparatus comprises a color information input line for applying external digital color information directly to said first latch means; and third switching means for inputting the digital color information from said color palette RAM at its one input terminal and the external digital color information from said first latch means at its other input terminal, selecting one of the inputted information in response to an external third control signal and outputting the selected information to the input terminals of said first and second switching means inputting the digital color information from said color palette RAM.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
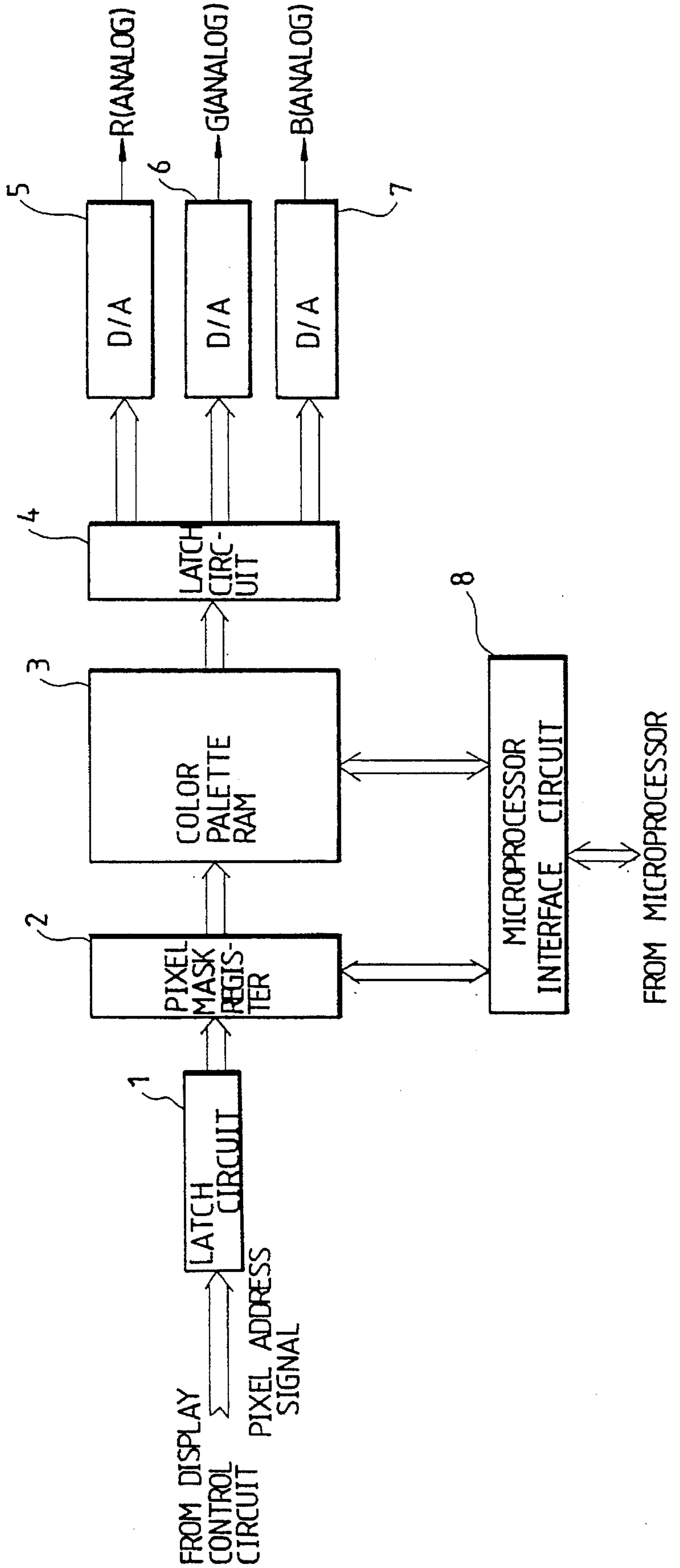
Fig.1 (Prior Art)
FIG. 1 is a block diagram of a conventional palette DAC apparatus.
Figure 2:
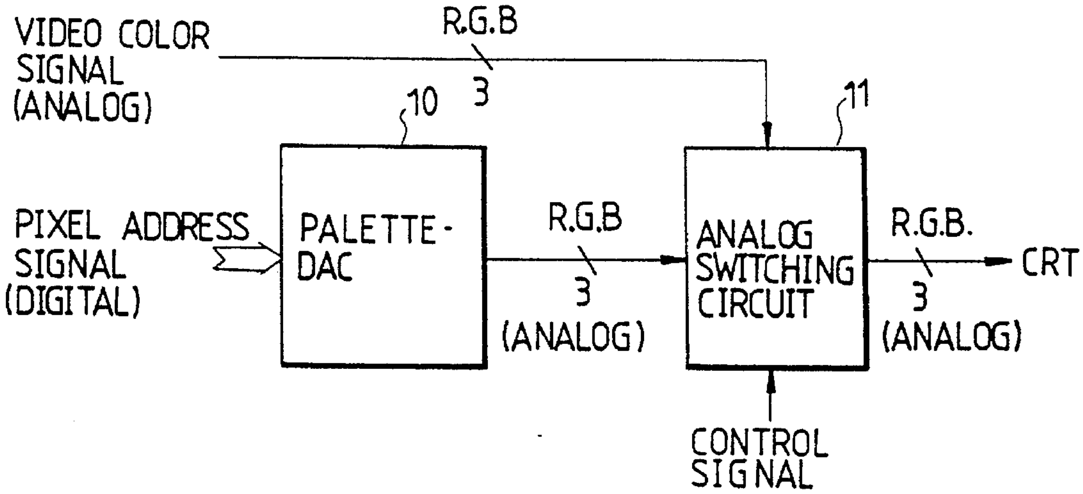
Fig. 2 (Prior Art)
FIGS. 2 to 4 are block diagrams illustrating examples of conventional display circuits using the conventional palette DAC apparatus in FIG. 1.
Figure 3:
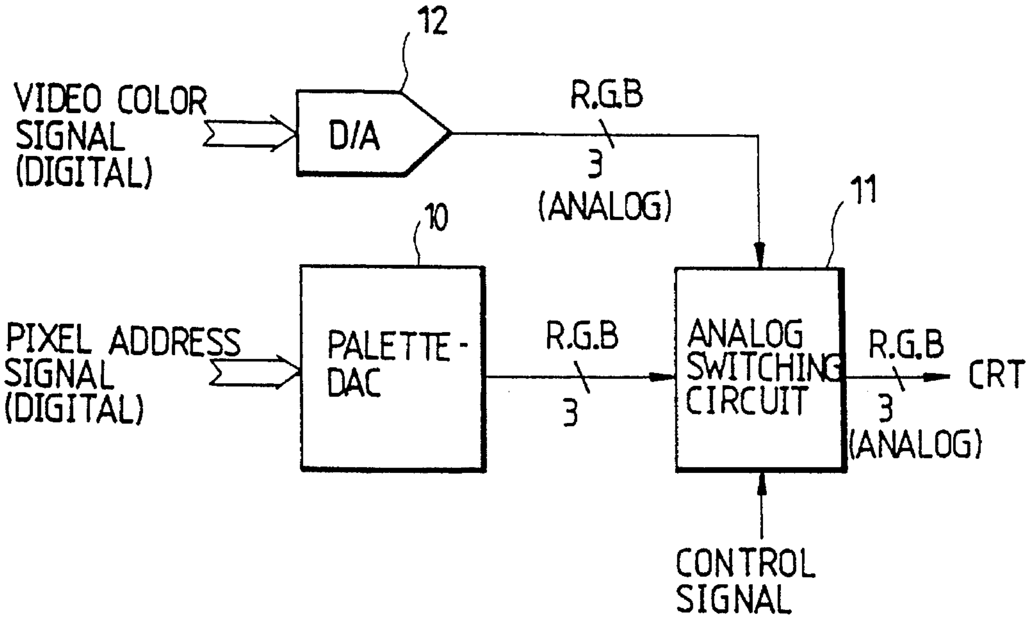
Fig. 3 (Prior Art)
Figure 4:
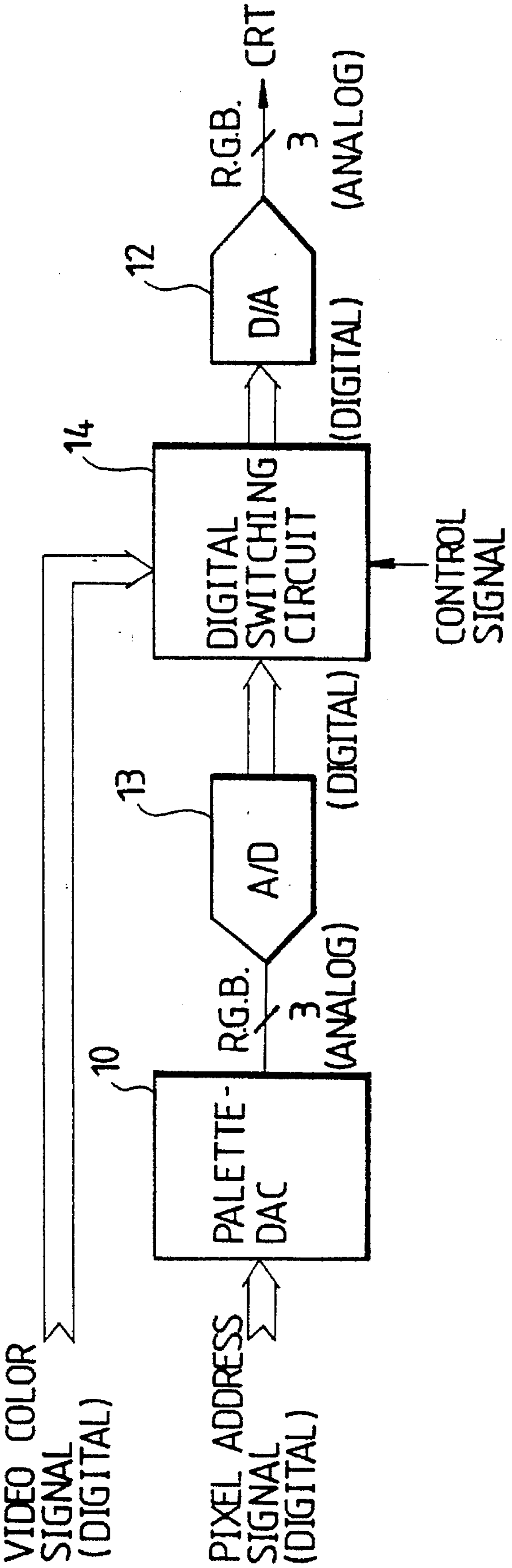
Fig.4 (Prior Art)
Figure 5:
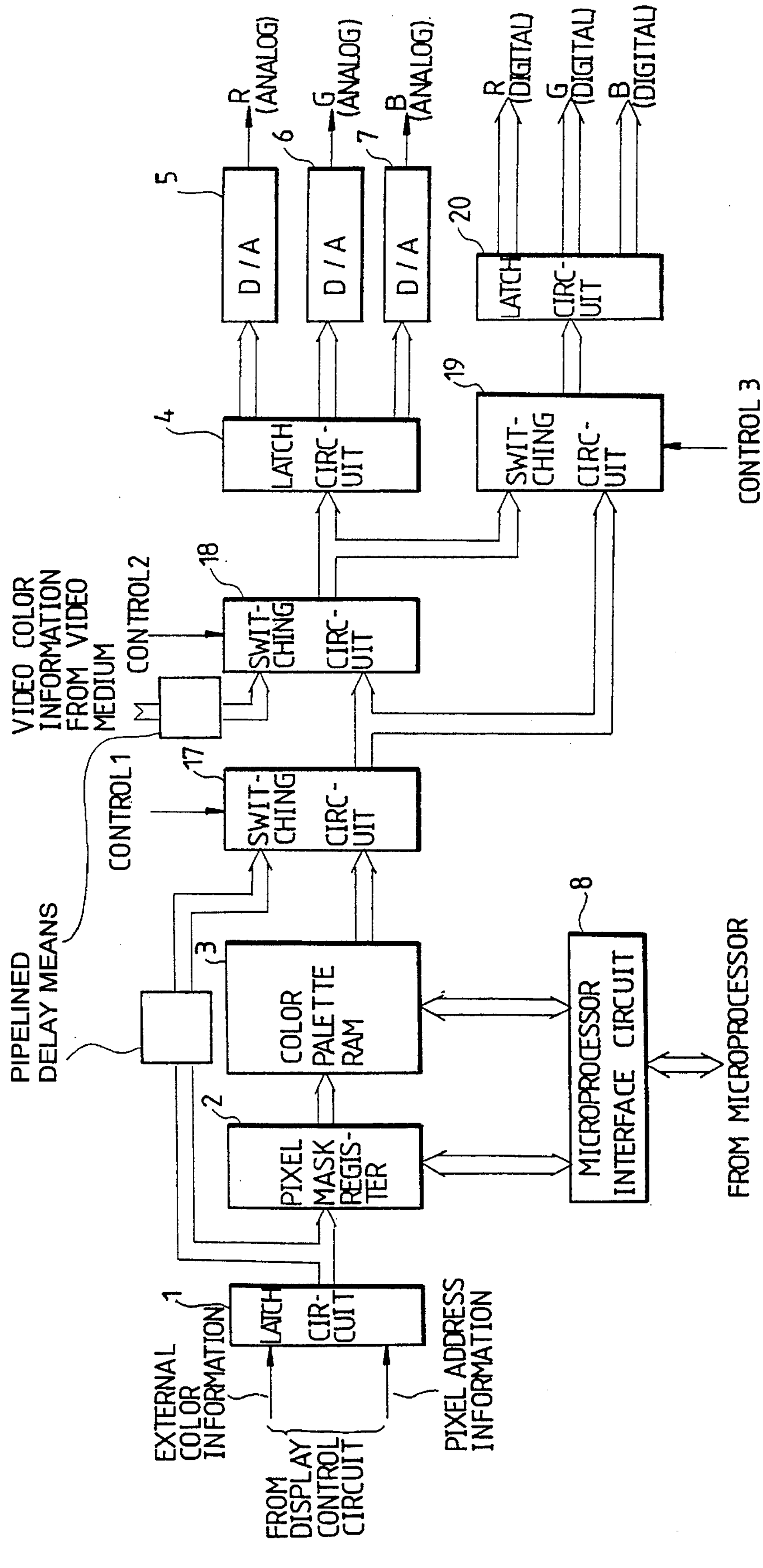
FIG. 5 is a block diagram of a palette DAC apparatus in accordance with the present invention.

Referring to FIG. 5, there is shown a block diagram of a palette DAC apparatus in accordance with the present invention. Some of parts in FIG. 5 are the same as those in FIG. 1. Therefore, like reference numerals designate like parts.

In FIG. 5, the latch circuit 1 is provided in the palette DAC apparatus to input the pixel address signal from the display control circuit or an external digital color information.

The microprocessor interface circuit 8 is also provided in the palette DAC apparatus to transfer digital color information from the external microprocessor to the color palette RAM 3 and vice versa. The microprocessor interface circuit 8 is also adapted to transfer a control signal or a masking pattern determination value from the microprocessor to the pixel mask register 2 and an address signal from the microprocessor to the color palette RAM 3.

The pixel mask register 2 is adapted to selectively mask the pixel address signal from the latch circuit 1 in response to the masking pattern determination value from the microprocessor interface circuit 8.

The color palette RAM 3 is also provided in the palette DAC apparatus to store the digital color information from the microprocessor interface circuit 8 in its location corresponding to the address signal from the microprocessor interface circuit 8 and output the digital color information stored in the corresponding location to the microprocessor interface circuit 8. The color palette RAM 3 is also adapted to output the digital color information stored in its location corresponding to the pixel address signal from the pixel mask register 2.

The latch circuit 4 is adapted to store the digital color information from the color palette RAM 3 or different digital color information temporarily.

The three digital/analog converters 5–7 are also provided in the palette DAC apparatus to convert the digital color information from the latch circuit 4 into the analog R, G and B color information.

Also, the palette DAC apparatus comprises a switching circuit 17 for inputting the digital color information from the color palette RAM 3 and the external digital color information from the latch circuit 1 and selecting one of the inputted information in response to an external control signal CONTROL1, a switching circuit 18 for inputting the digital output information from the switching circuit 17 and the digital video color information which is directly applied from the external video medium through an independent input terminal of the apparatus, selecting one of the inputted information in response to an external control signal CONTROL2 and outputting the selected information to the latch circuit 4, and a switching circuit 19 for inputting the digital output information from the switching circuits 17 and 18 and selecting one of the inputted information in response to an external control signal CONTROL3.

A latch circuit 20 is also provided in the palette DAC apparatus to input the digital output information from the switching circuit 19 and output the inputted digital information to a digital color information output terminal.

In detail, the external digital color information may be applied directly to the latch circuit 1 through an input line for the pixel address signal, for the purpose of breaking from the limited display process in which only the color information corresponding to the pixel address signal is displayed by using the latch circuit 1, the pixel mask register 2 and the color palette RAM 3. To this end, the switching circuit 17 functions to input the digital color information from the color palette RAM 3 and the external digital color information from the latch circuit 1 and select one of the inputted information in response to the external control signal CONTROL1. In accordance with the preferred embodiment of the present invention, the switching circuit 17 may be omitted as needed. In this case, the output of the color palette RAM 3 is directly connected to the inputs of the switching circuits 18 and 19 and the input signal to the latch circuit 1 is limited to the pixel address signal.

The switching circuit 18 acts to input the digital output information from the switching circuit 17 and the digital video color information which is directly applied from the external video medium through the independent input terminal, select one of the inputted information in response to the external control signal CONTROL2 and output the selected information to the latch circuit 4.

For example, in the case where the video color signal information from one of the video media such as the TV, the VCR (VTR), the video camera, the CD and the like is selected by the switching circuit 18 and then displayed on a part of the screen, the switching circuit 19 functions for the re-process of the digital color information from the color palette RAM 3 or the digital color information from the latch circuit 1, not displayed, in the palette DAC apparatus. Namely, the switching circuit 19 inputs the digital output information from the switching circuits 17 and 18, selects one of the inputted information in response to the external control signal CONTROL3 and outputs the selected information to the latch circuit 20.

The control signals CONTROL1-3 are applied from the outside of the palette DAC apparatus to the switching circuits 17–19, respectively. Each of the control signals CONTROL1-3 is in an asynchronous relation with a pixel clock which is a basis of the operation of the palette DAC apparatus.

The operation of the palette DAC apparatus with the above-mentioned construction will hereinafter be described in detail.

In FIG. 5, the latch circuit 1 inputs the pixel address signal similarly to that of the conventional palette DAC apparatus. Also, the latch circuit 1 inputs directly the external digital color information through the pixel address signal input line.

The digital color signal information directly inputted through the pixel address signal input line may be stored or read at the outside of the palette DAC apparatus according to a signal flow of an existing information processing system in the PC. As a result, a transfer flow of the directly inputted digital color signal information is the same as that of the pixel address signal from the PC and is independent of that of the video color signal information from the external video medium. Therefore, it is possible to input the digital color signal through the pixel address signal input line.

In order to selectively process the external digital color signal information as well as the pixel address signal inputted through the pixel address signal input line, an operating state of the switching circuit 17 is determined according to a logical state of the external control signal CONTROL1 or a logical value which is applied from the microprocessor interface circuit 8 and then stored in a predetermined register in a software manner.

The switching circuit 17 inputs the two digital color information in addition to the external control signal CONTROL1. Namely, the switching circuit 17 inputs the digital color information from the latch circuit 1 and the digital color information which is outputted from the color palette RAM 3 in response to the pixel address signal through the latch circuit 1 and the pixel mask register 2. In this connection, in order to match an arrival time of the digital color information from the latch circuit 1 to the switching circuit 17 with that of the digital color information from the color palette RAM 3 to the switching circuit 17, a pipelined time delay circuit may be connected between the latch circuit 1 and the switching circuit 17.

The digital video color information from the external video medium is directly applied through the independent input terminal of the palette DAC apparatus to the switching circuit 18, which is also applied with the output information from the switching circuit 17. The switching circuit 18 selects one of the inputted information in response to the external control signal CONTROL2 and outputs the selected information to the latch circuit 4.

The operation of the switching circuit 18 is performed in such a manner that the color information from the color palette RAM 3 corresponding to the pixel address signal or the color information directly inputted through the pixel address signal input line can be displayed on one area of the screen through the digital/analog converters 5–7 and the video color information directly inputted through the independent input terminal from the external video medium can be displayed on the other area of the screen through the digital/analog converters 5–7.

The switching circuit 18 inputs the two digital color information in addition to the external control signal CONTROL2. Namely, the switching circuit 18 inputs the digital video color information which is applied from the external video medium through the independent input terminal and the output information from the switching circuit 17. Here, the output information of the switching circuit 17 is the digital color information from the latch circuit 1 or the digital color information which is outputted from the color palette RAM 3 in response to the pixel address signal through the latch circuit 1 and the pixel mask register 2. In this connection, in order to match an arrival time of the digital color information from the independent input terminal to the switching circuit 18 with that of the output information from the switching circuit 17 to the switching circuit 18, a pipelined time delay circuit may be connected between the independent input terminal and the switching circuit 18.

The switching circuit 19 inputs the digital output information from the switching circuits 17 and 18, selects one of the inputted information in response to the external control signal CONTROL3 and outputs the selected information to the latch circuit 20.

The operation of the switching circuit 19 is performed in such a manner that the digital color information of the same value as that of the output analog color information from the palette DAC apparatus can be outputted through the latch circuit 20 to the outside of the palette DAC apparatus. Also, the switching circuit 19 functions to output the color information different from that being now displayed on a part of the screen through the latch circuit 20 to the outside of the palette DAC apparatus. Namely, for example, when the video color information from the independent input terminal is being now displayed on a part of the screen, the color information from the color palette RAM 3 or the color information directly inputted from the pixel address signal input line not displayed on the screen is outputted by the switching circuit 19 through the latch circuit 20 to the outside of the palette DAC apparatus. This is performed for the re-process of the color information different from that being now displayed on a part of the screen for various purposes. Therefore, the use of the color signal information can be broadened in range.

The latch circuits 4 and 20 are used to provide the analog and digital color information output synchronously with the pixel clock, respectively. The latch circuit 20 may be omitted as needed.

Although not shown, the pixel clock is applied to all the components in FIG. 5.

Figure 6:
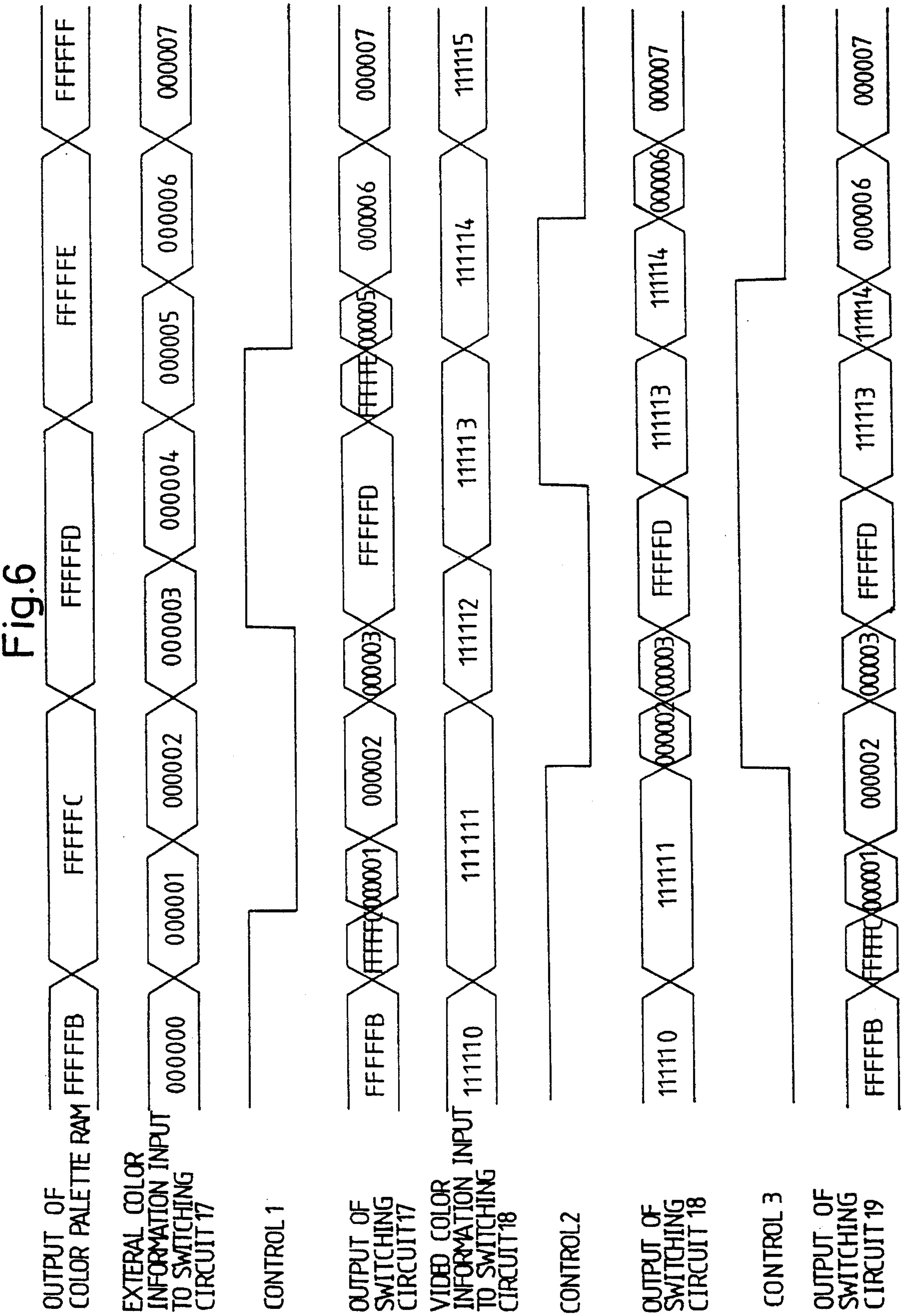
FIG. 6 is a timing diagram of signals from respective components in the palette DAC apparatus in FIG. 5.

FIG. 6 is a timing diagram of the signals from the respective components in the palette DAC apparatus in FIG. 5. As shown in this drawing, the switching circuit 17 outputs the color signal information from the color palette RAM 3 corresponding to the pixel address signal if the control signal CONTROL1 is high and the color signal information directly inputted through the pixel address signal input line if the control signal CONTROL1 is low. The switching circuit 18 outputs the video color signal information directly inputted through the independent input terminal if the control signal CONTROL2 is high and the output information from the switching circuit 17 if the control signal CONTROL2 is low. The switching circuit 19 outputs the output information from the switching circuit 18 if the control signal CONTROL3 is high and the output information from the switching circuit 17 if the control signal CONTROL3 is low.

Each of the switching circuits 17–19 functions to input the two types of digital information and the corresponding control signal and selectively output one of the inputted information according to a logical state of the corresponding control signal.

FIGS. 7A to 7D and 8A to 8E are circuit diagrams illustrating various embodiments of the switching circuits 17–19. Noticeably, each of the first to third switching circuits 17–19 comprises unit switching circuits of the same number as that of bits of the inputted information. In this connection, one of the unit switching circuits is shown in each of the drawings for illustrative purposes. In these drawings, each unit switching circuit is shown to select one of two different inputs under a digital logic condition.

In FIGS. 7A to 7D, each unit switching circuit comprises two input terminals and a control input terminal to select one of two different inputs IN1 and IN2 in response to a corresponding one of the control signal CONTROL1-3, referred commonly to hereinafter as C0. Also, an additional logic circuit is provided in each unit switching circuit to prevent a transfer delay of the output signal due to the influence of a loading effect of a fan out circuit at an output terminal of each unit switching circuit.

Hence, each unit switching circuit essentially comprises a switching operating circuit part and a control circuit part for controlling the signal transfer delay resulting from the loading effect, as shown in FIGS. 7A to 7D and 8A to 8E.

Figure 7A:
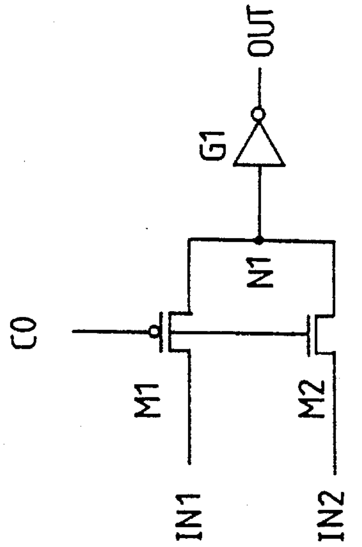
FIGS. 7A to 7D are circuit diagrams illustrating embodiments of the switching circuits having two input terminals and a control input terminal for the palette DAC apparatus of FIG. 5.

In FIG. 7A, each unit switching circuit comprises a PMOS transistor M1 having a gate for inputting the corresponding control signal C0 and a source for inputting the input signal IN1, a NMOS transistor M2 having a gate for inputting the corresponding control signal C0, a drain for inputting the input signal IN2 and a source connected to a drain of the PMOS transistor M1, and a logic device G1 having an input terminal connected to a common connection point N1 of the drain of the PMOS transistor M1 and the source of the NMOS transistor M2. The PMOS and NMOS transistors M1 and M2 are switched according to the logical state of the control signal C0 to transfer one of the input signals IN1 and IN2 to an output terminal OUT.

The logic device G1 has an electrical operating characteristic of driving the selected input signal IN1 or IN2 by steps to control the signal transfer delay resulting from the loading effect at the output terminal OUT.

As a result, in each unit switching circuit, one of the input signals IN1 and IN2 is selected and then transferred through the logic device G1 to the output terminal OUT.

According to the logical state of the control signal C0, one of the PMOS and NMOS transistors M1 and M2 is turned on, whereas the other is turned off. In the case where the PMOS transistor M1 is turned on according to the logical state of the control signal C0 and thus transfers a low logical value inputted therein to its output, the transferred low logical value becomes higher approximately by a threshold voltage than the original input value. For this reason, the electrical transfer of the low logical value is incomplete as compared with the electrical transfer of a high logical value. Also, in the case where the NMOS transistor M2 is turned on according to the logical state of the control signal C0 and thus transfers a high logical value inputted therein to its output, the transferred high logical value becomes lower approximately by the threshold voltage than the original input value. For this reason, the electrical transfer of the high logical value is incomplete as compared with the electrical transfer of a low logical value. As a result, because the output terminal N1 of the PMOS and NMOS transistors M1 and M2 sometimes remains at an incomplete logical state, a transient delay of the signal transfer and an increased amount of transient current may occur at the logic device G1 at the output of each unit switching circuit.

Figure 7B:
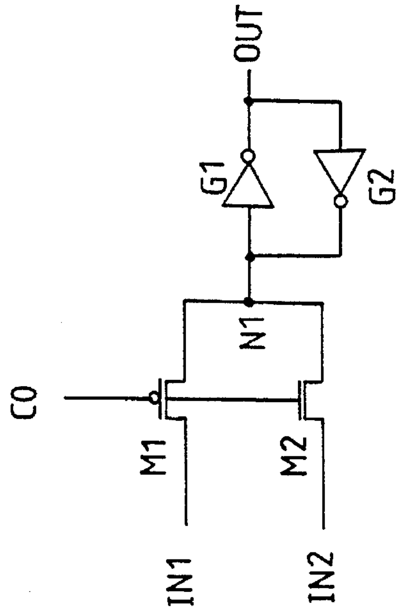

In this connection, in order to maintain the output terminal N1 of the PMOS and NMOS transistors M1 and M2 complete, a logic device G2 may be connected in parallel to the logic device G1 so that the logic devices G1 and G2 can have input/output connections contrary to each other, as shown in FIG. 7B. Namely, the logic device G2 has an input terminal connected to the output terminal of the logic device G1 and an output terminal connected to the input terminal of the logic device G1.

In FIG. 7B, each unit switching circuit comprises the PMOS and NMOS transistors M1 and M2 and the logic devices G1 and G2. The gate of the PMOS transistor M1 inputs the corresponding control signal C0 and the source thereof inputs the input signal IN1. The gate of the NMOS transistor M2 inputs the corresponding control signal C0, the drain thereof inputs the input signal IN2 and the source thereof is connected to the drain of the PMOS transistor M1. The input terminal of the logic device G1 is connected to the common connection point N1 of the drain of the PMOS transistor M1 and the source of the NMOS transistor M2 to transfer one of the input signals IN1 and IN2 selected by switching operations of the-PMOS and NMOS transistors M1 and M2 to the output terminal OUT of each unit switching circuit. The logic device G2 is connected in parallel to the logic device G1 so that the logic devices G1 and G2 can have the input/output connections contrary to each other.

In this case, the output node N1 of the PMOS and NMOS transistors M1 and M2 can return to a complete logical state under the influence of a signal feedback effect of the additional logic device G2. However, since the input signals IN1 and IN2 to each unit switching circuit are in a direct signal flow relation with the output terminal of the additional logic device G2, an additional current consumption and a transient delay of the signal transfer may take place due to a short-circuit of power supply and ground lines VDD and GND at a transient state.

Figure 7C:
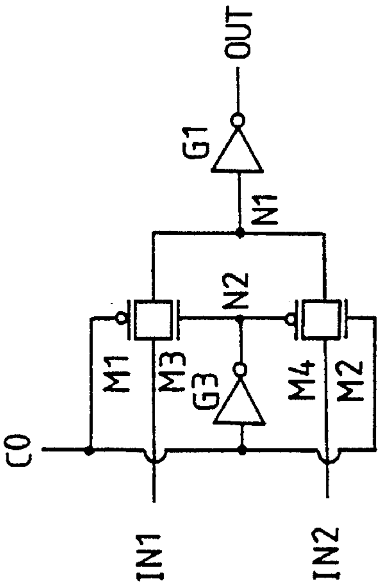

In this connection, in order to transfer the input logical value perfectly to the output terminal, a NMOS transistor M3 may be connected in parallel to the PMOS transistor M1 and a PMOS transistor M4 may be connected in parallel to the NMOS transistor M2, as shown in FIG. 7C. The NMOS transistor M3 has an electrical complementary characteristic to the PMOS transistor M1 and is controlled based on the opposite logical value to that of the PMOS transistor M1. Also, the NMOS transistor M3 has the same input/output connections as those of the PMOS transistor M1. The PMOS transistor M4 has an electrical complementary characteristic to the NMOS transistor M2 and is controlled based on the opposite logical value to that of the NMOS transistor M2. Also, the PMOS transistor M4 has the same input/output connections as those of the NMOS transistor M2 which inputs the input signal different from that of the PMOS transistor M1.

In FIG. 7C, an inverted one of the control signal C0 must be applied to gates of the additional NMOS and PMOS transistors M3 and M4 to match the operating characteristics of the NMOS and PMOS transistors M3 and M4 with those of the PMOS and NMOS transistors M1 and M2 which are selected according to the logical state of the control signal C0. Hence, a logic device G3 is provided to invert the control signal C0 and apply the inverted control signal to the gates of the additional NMOS and PMOS transistors M3 and M4.

In this case, the inverted control signal to the gates of the NMOS and PMOS transistors M3 and M4 is delayed by a signal transfer time of the logic device G3 as compared with the control signal C0 to the gates of the PMOS and NMOS transistors M1 and M2.

Figure 7D:
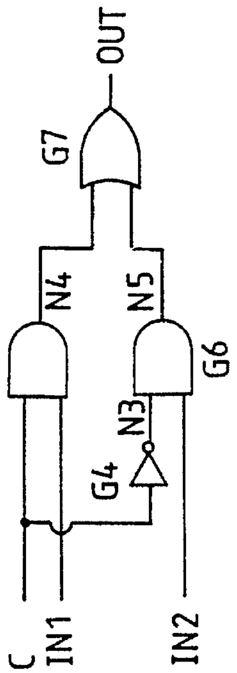

In FIG. 7D each unit switching circuit is provided with only logic devices differently from the constructions in FIGS. 7A to 7C. The construction of FIG. 7D has a disadvantage in that the logic devices are large in number and the resultant construction is complex.

The constructions of FIGS. 7A to 7D are sensitive to a noise of the control signal C0 since they are directly controlled by the control signal C0.

In FIGS. 8A to 8E, there are shown constructions of the unit switching circuits having high noise immunity. In these drawings, secondary control signals C1 and C2 are generated based on the original control signal C0 in the constructions of FIGS. 8B to 8E and then applied to the construction of FIG. 8A. As a result, each unit switching circuit is formed by connecting the construction of FIG. 8A to the constructions of FIGS. 8B to BE, respectively.

Figure 8B:
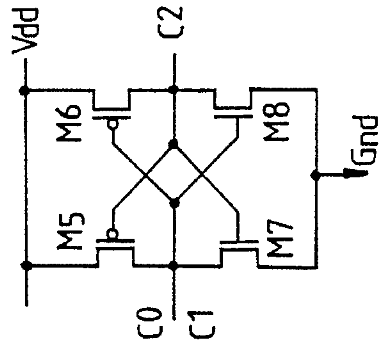
FIGS. 8A to 8E are circuit diagrams illustrating embodiments of the switching circuits having high noise immunity for the palette DAC apparatus of FIG. 5.

In FIG. 8B, there is shown a first embodiment for generating the secondary control signals C1 and C2 based on the control signal C0. As shown in this figure, each unit switching circuit comprises a PMOS transistor M5 having a source connected to the power supply line VDD and a NMOS transistor M7 having a-source connected to the ground line GND and a drain connected to a drain of the PMOS transistor M5. A common connection point of the drains of the PMOS and NMOS transistors M5 and M7 forms a common output terminal. The combination of the PMOS and NMOS transistors M5 and M7 forms an inverter circuit.

Also, each unit switching circuit comprises a PMOS transistor M6 having a source connected to the power supply line VDD and a NMOS transistor M8 having a source connected to the ground line GND and a drain connected to a drain of the PMOS transistor M6. Similarly, a common connection point of the drains of the PMOS and NMOS transistors M6 and M8 forms a common output terminal. The combination of the PMOS and NMOS transistors M6 and M8 forms an inverter circuit.

Gates of the PMOS and NMOS transistors M5 and M7 are connected to the common output terminal of the inverter circuit of the PMOS and NMOS transistors M6 and M8. On the contrary, gates of the PMOS and NMOS transistors M6 and M8 are connected to the common output terminal of the inverter circuit of the PMOS and NMOS transistors M5 and M7. Namely, the inverter circuits have input/output connections crossed to each other.

In the inverter circuits with the above-mentioned construction, the control signal C0 is applied to a desired terminal and the secondary control signals C1 and C2 are generated from the common output terminals of the inverter circuits. Namely, the control signal C0 is applied to the common output terminal of the inverter circuit of the PMOS and NMOS transistors M5 and M7 or the gates of the PMOS and NMOS transistors M6 and M8. Also, the secondary control signal C1 is outputted from the common output terminal of the inverter circuit of the PMOS and NMOS transistors M5 and M7 or the gates of the PMOS and NMOS transistors M6 and M8. The secondary control signal C2 is outputted from the common output terminal of the inverter circuit of the PMOS and NMOS transistors M6 and M8 or the gates of the PMOS and NMOS transistors M5 and M7.

In the construction of FIG. 8B, when the logical value of the existing control signal C0 is opposite to that of the control signal C0 newly inputted, there may be present an electrical transient state in which the power supply and ground lines VDD and GND are short-circuited at the crossed state of the PMOS and NMOS transistors M5 and M7 and the PMOS and NMOS transistors M6 and M8. The transient state results in an increase in a producing time of the secondary control signals C1 and C2 to be newly generated and an increase in an amount of transient current.

Figure 8A:
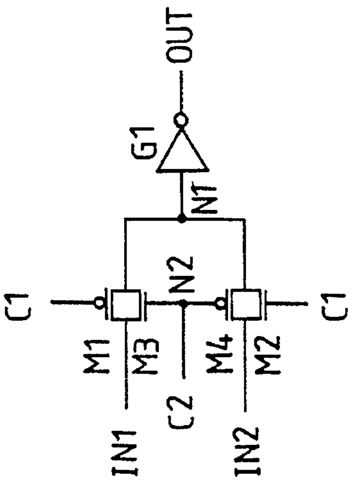
Figure 8E:
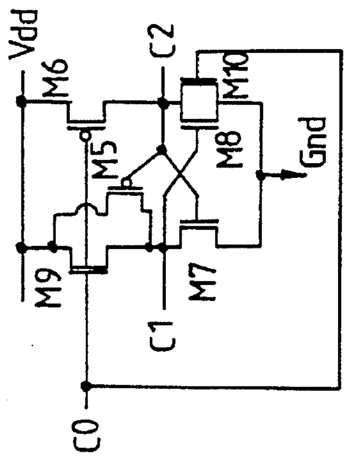
Figure 8D:
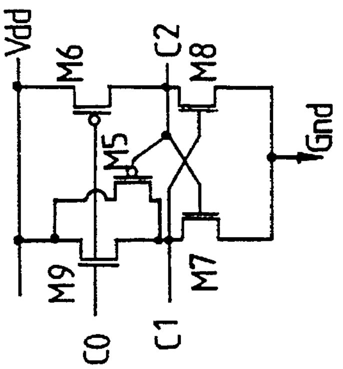
Figure 8C:
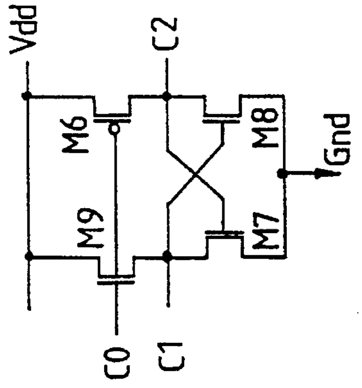

A circuit for solving the problem brought up in FIG. 8B is shown in FIG. 8C. In this drawing, a NMOS transistor M9 is used instead of the PMOS transistor M5 in FIG. 8B. The control signal C0 is applied to a gate of the NMOS transistor M9 and the gate of the PMOS transistor M6. The power supply line VDD is connected to a drain of the NMOS transistor M9 and the source of the PMOS transistor M6. The ground line GND is connected to the source of the NMOS transistor M7, the drain of which is connected to a source of the NMOS transistor M9. The gate of the NMOS transistor M8 is connected to a common connection point of the source of the NMOS transistor M9 and the drain of the NMOS transistor M7, from which the secondary control signal C1 is outputted.

The ground line GND is also connected to the source of the NMOS transistor M8, the drain of which is connected to the drain of the PMOS transistor M6. The gate of the NMOS transistor M7 is connected to a common connection point of the drains of the PMOS and NMOS transistors M6 and M8, from which the secondary control signal C2 is outputted.

In the construction of FIG. 8C, there is no short-circuit of the power supply and ground lines VDD and GND. However, a high logical value of the secondary control signal C1 becomes lower by the threshold voltage than a voltage from the power supply line VDD since the drain of the NMOS transistor M9 is directly connected to the power supply line VDD. For this reason, a logical value transient characteristic in the production of the secondary control signals C1 and C2 is made bad. Also, the final high logical value of the secondary control signal C1 becomes lower than that of the secondary control signal C2. As a result, the secondary control signal C1 is unqualified as a control signal.

In FIG. 8D, there is shown a circuit for making up for the final high logical value characteristic of the secondary control signal C1. As shown in this drawing, the existing NMOS transistor M9 is connected in parallel to the additional PMOS transistor M5, the gate of which is connected to the secondary control signal C2.

Namely, the gate of the NMOS transistor M9 inputs the control signal C0 and the drain thereof is connected to the power supply line VDD. The gate of the PMOS transistor M6 inputs the control signal C0 and the source thereof is connected to the power supply line VDD. The drain of the NMOS transistor M7 is connected to the source of the NMOS transistor M9, the source thereof is connected to the ground line GND and the gate thereof is connected to the drain of the PMOS transistor M6. The drain of the NMOS transistor M8 is connected to the drain of the PMOS transistor M6, the source thereof is connected to the ground line GND and the gate thereof is connected to the source of the NMOS transistor M9. The source of the PMOS transistor M5 is connected to the drain of the NMOS transistor M9, the drain thereof is connected to the source of the NMOS transistor M9 and the gate thereof is connected to the gate of the NMOS transistor M7.

In the case where the construction of FIG. 8A is coupled to the construction of FIG. 8D, the source of the PMOS transistor M1 inputs the input signal IN1 and the gate thereof is connected to a common connection point of the source of the NMOS transistor M9, the drain of the NMOS transistor M7 and the drain of the PMOS transistor M5. The drain of the NMOS transistor M3 is connected to the source of the PMOS transistor M1 to input the input signal IN1, the gate thereof is connected to a common connection point of the drains of the PMOS and NMOS transistors M6 and M8 and the source thereof is connected to the drain of the PMOS transistor M1. The drain of the NMOS transistor M2 inputs the input signal IN2 and the gate thereof is connected to the common connection point of the source of the NMOS transistor M9, the drain of the NMOS transistor M7 and the drain of the PMOS transistor M5. The source of the PMOS transistor M4 is connected to the drain of the NMOS transistor M2 to input the input signal IN2, the gate thereof is connected to the common connection point of the drains of the PMOS and NMOS transistors M6 and M8 and the drain thereof is connected to the source of the NMOS transistor M2. The input terminal of the logic device G1 is connected commonly to a common connection point of the drain of the PMOS transistor M1 and the source of the NMOS transistor M3 and a common connection point of the source of the NMOS transistor M2 and the drain of the PMOS transistor M4 to transfer one of the input signals IN1 and IN2 selected by switching operations of the PMOS and NMOS transistors M1–M4 to the output terminal OUT of each unit switching circuit.

In the construction of FIG. 8D, the final high logical value characteristic of the secondary control signal C1 is enhanced based on an electrical characteristic of the PMOS transistor M5. However, the logical value transient characteristic in the production of the secondary control signals C1 and C2 based on the control signal C0 is still bad since there cannot readily be overcome the short-circuit of the power supply and ground lines VDD and GND resulting from the combination of the NMOS and PMOS transistors M9, M7 and M5 or M8 and M6 at the transient state.

In FIG. 8E, there is shown a circuit for enhancing the final high logical value characteristic of the secondary control signal C1 and the logical value transient characteristic of the secondary control signals C1 and C2. In this drawing, an additional NMOS transistor M10 is connected in parallel to the existing NMOS transistor M8. A gate of the NMOS transistor M10 is directly connected to the control signal C0 to enhance the logical value transient characteristic of the secondary control signals C1 and C2.

The construction of FIG. 8E can readily overcome the sensitivity to the noise of the control signal C0 because the operating characteristic of the circuit can be controlled by adjusting the sizes of the used transistors M5–M10.

One of the constructions of FIGS. 7A to 7D and 8A to 8E as mentioned above may be selected as the switching circuits 17–19 according to a design purpose.

Then, an output circuit for the latch circuit 20 in FIG. 5 will be described.

Generally, differently from a circuit for supplying an electrical signal to a load circuit in a chip, a digital output circuit in the chip must supply a sufficient amount of electrical signal to a load circuit at the outside of the chip over an external line. In this connection, the digital output circuit connected to the latch circuit 20 outputs a sufficient amount of electrical R, G and B signal information in proportion to the number of digital bits of the output color information synchronously with a clock signal to the outside of the chip. As a result, the outputted electrical signal information is very large in amount and the voltage from the power supply and ground lines VDD and GND used for the supply of the electrical signal is irregularly waved.

The irregular waving of the voltage from the power supply and ground lines VDD and GND in the chip results in an instantaneous voltage difference between the inside and outside of the chip. For this reason, a digital signal inputted to the chip may be recognized as a different signal at the outside of the chip. In order to solve this problem, an operating speed of the chip must be lowered resulting in an inconvenience. This inconvenience can be mitigated by connecting the power supply and ground lines VDD and GND to the output circuit separately from the circuitry in the chip.

As apparent from the above description, according to the present invention, the color information can be displayed on the screen and stored in the memory by the simple circuitry in the multimedia field. Also, the re-use of the color information can be performed variously.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A digital/analog conversion apparatus with a color palette RAM for a multimedia, comprising first latch means for inputting a pixel address signal from a display control circuit, microprocessor interface means for transferring digital color information from an external microprocessor to said color palette RAM and vice versa and transferring address and control signals from said microprocessor, a pixel mask register for selectively masking the pixel address signal from said first latch means in response to the control signal from said microprocessor interface means, said color palette RAM for storing the digital color information from said microprocessor interface means in its location corresponding to the address signal from said microprocessor interface means and outputting the digital color information stored in its location corresponding to the pixel address signal from said pixel mask register, second latch means for storing the digital color information from said color palette RAM or different digital color information temporarily, and first to third digital/analog conversion means for converting the digital color information from said second latch means into analog R, G and B color information, wherein the improvement comprises:

first switching means for inputting the digital color information from said color palette RAM at its one input terminal and digital video color information which is directly applied from an external video medium through an independent input terminal of the apparatus at its other input terminal, selecting one of the inputted information in response to an external first control signal and outputting the selected information to said second latch means;

second switching means for inputting the digital color information from said color palette RAM at its one input terminal and the output digital color information from said first switching means at its other input terminal, selecting one of the inputted information in response to an external second control signal and outputting the selected information; and third latch means for inputting the output digital color information from said second switching means and outputting the inputted digital information to a digital color information output terminal.

2. A digital/analog conversion apparatus with a color palette RAM for a multimedia, comprising first latch means for inputting a pixel address signal from a display control circuit, microprocessor interface means for transferring digital color information from an external microprocessor to said color palette RAM and vice versa and transferring address and control signals from said microprocessor, a pixel mask register for selectively masking the pixel address signal from said first latch means in response to the control signal from said microprocessor interface means, said color palette RAM for storing the digital color information from said microprocessor interface means in its location corresponding to the address signal from said microprocessor interface means and outputting the digital color information stored in its location corresponding to the pixel address signal from said pixel mask register, second latch means for storing the digital color information from said color palette RAM or different digital color information temporarily, and first to third digital/analog conversion means for converting the digital color information from said second latch means into analog R, G and B color information, wherein the improvement comprises:

first switching means for inputting the digital color information from said color palette RAM at its one input terminal and digital video color information which is directly applied from an external video medium through an independent input terminal of the apparatus at its other input terminal, selecting one of the inputted information in response to an external first control signal and outputting the selected information to said second latch means;

a color information input line for applying external digital color information directly to said first latch means; and second switching means for inputting the digital color information from said color palette RAM at its one input terminal and the external digital color information from said first latch means at its other input terminal, selecting one of the inputted information in response to an external second control signal and outputting the selected information to the input terminal of said first switching means inputting the digital color information from said color palette RAM.

3. A digital/analog conversion apparatus with a color palette RAM for a multimedia, as set forth in claim 1, further comprising:

a color information input line for applying external digital color information directly to said first latch means; and third switching means for inputting the digital color information from said color palette RAM at its one input terminal and the external digital color information from said first latch means at its other input terminal, selecting one of the inputted information in response to an external third control signal and outputting the selected information to the input terminals of said first and second switching means inputting the digital color information from said color palette RAM.

4. A digital/analog conversion apparatus with a color palette RAM for a multimedia, as set forth in claim 3, wherein each of said first to third switching means comprises unit switching circuits of the same number as that of bits of the inputted information, each of said unit switching circuits includes:

a PMOS transistor having a gate for inputting a corresponding one of the external first to third control signals and a source for inputting a first input signal;

a NMOS transistor having a gate for inputting the corresponding control signal, a drain for inputting a second input signal and a source connected to a drain of said PMOS transistor;

a first logic device having an input terminal connected to a common connection point of the drain of said PMOS transistor and the source of said NMOS transistor, said first logic device transferring one of the first and second input signals selected by switching operations of said PMOS and NMOS transistors to an output terminal of each unit switching circuit; and a second logic device having an input terminal connected to an output terminal of said first logic device and an output terminal connected to the input terminal of said first logic device.

5. A digital/analog conversion apparatus with a color palette RAM for a multimedia, as set forth in claims 3, wherein each of said first to third switching means comprises unit switching circuits of the same number as that of bits of the inputted information, each of said unit switching circuits includes:

a first PMOS transistor having a source for inputting a first input signal and a gate for inputting a corresponding one of the external first to third control signals;

a first NMOS transistor having a drain for inputting a second input signal and a gate for inputting the corresponding control signal;

a second NMOS transistor having a drain connected to the source of said first PMOS transistor to input the first input signal and a source connected to a drain of said first PMOS transistor;

a second PMOS transistor having a source connected to the drain of said first NMOS transistor to input the second input signal and a drain connected to a source of said first NMOS transistor;

a first logic device having an input terminal connected commonly to a common connection point of the drain of said first PMOS transistor and the source of said second NMOS transistor and a common connection point of the source of said first NMOS transistor and the drain of said second PMOS transistor, said first logic device transferring one of the first and second input signals selected by switching operations of said first and second PMOS and NMOS transistors to an output terminal of each unit switching circuit; and a second logic device for inverting the corresponding control signal and applying the inverted control signal to gates of said second PMOS and NMOS transistors.

6. A digital/analog conversion apparatus with a color palette RAM for a multimedia, as set forth in claim 3, wherein each of said first to third switching means comprises unit switching circuits of the same number as that of bits of the inputted information, each of said unit switching circuits includes:

a first NMOS transistor having a gate for inputting a corresponding one of the external first to third control signals and a drain connected to a power supply line;

a first PMOS transistor having a gate for inputting the corresponding control signal and a source connected to the power supply line;

a second NMOS transistor having a drain connected to a source of said first NMOS transistor, a source connected to a ground line and a gate connected to a drain of said first PMOS transistor;

a third NMOS transistor having a drain connected to the drain of said first PMOS transistor, a source connected to the ground line and a ate connected to the source of said first NMOS transistor;

a second PMOS transistor having a source connected to the drain of said first NMOS transistor, a drain connected to the source of said first NMOS transistor and a ate connected to the ate of said second NMOS transistor;

a third PMOS transistor having a source for inputting a first input signal and a gate connected to a common connection point of the source of said first NMOS transistor the drain of said second NMOS transistor and the drain of said second PMOS transistor;

a fourth NMOS transistor having a drain connected to the source of said third PMOS transistor to input the first input signal, a gate connected to a common connection point of the drain of said first PMOS transistor and the drain of said third NMOS transistor and a source connected to a drain of said third PMOS transistor;

a fifth NMOS transistor having a drain for inputting a second input signal and a gate connected to the common connection point of the source of said first NMOS transistor, the drain of said second NMOS transistor and the drain of said second PMOS transistor;

a fourth PMOS transistor having a source connected to the drain of said fifth NMOS transistor to input the second input signal, a gate connected to the common connection point of the drain of said first PMOS transistor and the drain of said third NMOS transistor and a drain connected to a source of said fifth NMOS transistor; and a logic device having an input terminal connected commonly to a common connection point of the drain of said third PMOS transistor and the source of said fourth NMOS transistor and a common connection point of the source of said fifth NMOS transistor and the drain of said fourth PMOS transistor, said logic device transferring one of the first and second input signals selected by switching operations of said third and fourth PMOS transistors and said fourth and fifth NMOS transistors to an output terminal of each unit switching circuit.

7. A digital/analog conversion apparatus with a color palette RAM for a multimedia, as set forth in claim 3, wherein each of said first to third switching means comprises unit switching circuits of the same number as that of bits of the inputted information, each of said unit switching circuits includes:

a first NMOS transistor having a gate for inputting a corresponding one of the external first to third control signals and a drain connected to a power supply line;

a first PMOS transistor having a gate for inputting the corresponding control signal and a source connected to the power supply line;

a second NMOS transistor having a drain connected to a source of said first NMOS transistor, a source connected to a ground line and a gate connected to a drain of said first PMOS transistor;

a third NMOS transistor having a drain connected to the drain of said first PMOS transistor, a source connected to the ground line and a gate connected to the source of said first NMOS transistor;

a second PMOS transistor having a source connected to the drain of said first NMOS transistor, a drain connected to the source of said first NMOS transistor and a gate connected to the gate of said second NMOS transistor;

a fourth NMOS transistor having a drain connected to the drain of said third NMOS transistor, a source connected to the source of said third NMOS transistor and a gate for inputting the corresponding control signal;

a third PMOS transistor having a source for inputting a first input signal and a gate connected to a common connection point of the source of said first NMOS transistor, the drain of said second NMOS transistor and the drain of said second PMOS transistor;

a fifth NMOS transistor having a drain connected to the source of said third PMOS transistor to input the first input signal, a gate connected to a common connection point of the drain of said first PMOS transistor, the drain of said third NMOS transistor and the drain of said fourth NMOS transistor and a source connected to a drain of said third PMOS transistor;

a sixth NMOS transistor having a drain for inputting a second input signal and a gate connected to the common connection point of the source of said first NMOS transistor, the drain of said second NMOS transistor and the drain of said second PMOS transistor;

a fourth PMOS transistor having a source connected to the drain of said sixth NMOS transistor to input the second input signals a gate connected to the common connection point of the drain of said first PMOS transistor, the drain of said third NMOS transistor and the drain of said fourth NMOS transistor and a drain connected to a source of said sixth NMOS transistor; and a logic device having an input terminal connected commonly to a common connection point of the drain of said third PMOS transistor and the source of said fifth NMOS transistor and a common connection point of the source of said sixth NMOS transistor and the drain of said fourth PMOS transistor, said logic device transferring one of the first and second input signals selected by switching operations of said third and fourth PMOS transistors and said fifth and sixth NMOS transistors to an output terminal of each unit switching circuit.

8. A digital/analog conversion apparatus with a color palette RAM for a multimedia, as set forth in claim 3, wherein the first to third control signals are applied from the outside of the apparatus, respectively, to said first to third switching means asynchronously with a pixel clock which is an operating basis of the apparatus.

9. A digital/analog conversion apparatus with a color palette RAM for a multimedia, as set forth in claim 2, further comprising:

pipelined time delay means connected between said first latch means and said second switching means for matching an arrival time of the external digital color information from said first latch means to said second switching means with that of the digital color information from said color palette RAM to said second switching means.

10. A digital/analog conversion apparatus with a color palette RAM for a multimedia, comprising first latch means for inputting a pixel address signal from a display control circuit, a pixel mask register for selectively masking the pixel address signal from said first latch means in response to the control signal from said microprocessor interface means, said color palette RAM for storing the digital color information from said microprocessor interface means in its location corresponding to the address signal from said microprocessor interface means and outputting the digital color information stored in its location corresponding to the pixel address signal from said pixel mask register, second latch means for storing the digital color information from said color palette RAM or different digital color information temporarily, and first to third digital/analog conversion means for converting the digital color information from said second latch means into analog R, G and B color information, wherein the improvement comprises:

first switching means for inputting the digital color information from said color palette RAM at its one input terminal and digital video color information which is directly applied from an external video medium through an independent input terminal of the apparatus at its other input terminal, selecting one of the inputted information in response to an external first control signal and outputting the selected information to said second latch means;

second switching means for inputting the digital color information from said color palette RAM at its one input terminal and the output digital color information from said first switching means at its other input terminal, selecting one of the inputted information in response to an external second control signal and outputting the selected information.

11. A digital/analog conversion apparatus with a color palette RAM for a multimedia, as set forth in claim 10, further comprising:

a color information input line for applying external digital color information directly to said first latch means; and third switching means for inputting the digital color information from said color palette RAM at its one input terminal and the external digital color information from said first latch means at its other input terminal, selecting one of the inputted information in response to an external third control signal and outputting the selected information to the input terminals of said first and second switching means inputting the digital color information from said color palette RAM.

12. A digital/analog conversion apparatus with a color palette RAM for a multimedia, as set forth in claim 11, wherein each of said first to third switching means comprises unit switching circuits of the same number as that of bits of the inputted information, each of said unit switching circuits includes:

a PMOS transistor having a gate for inputting a corresponding one of the external first to third control signals and a source for inputting a first input signal;

a NMOS transistor having a gate for inputting the corresponding control signal, a drain for inputting a second input signal and a source connected to a drain of said PMOS transistor;

a first logic device having an input terminal connected to a common connection point of the drain of said PMOS transistor and the source of said NMOS transistor, said first logic device transferring one of the first and second input signals selected by switching operations of said PMOS and NMOS transistors to an output terminal of each unit switching circuit; and a second logic device having an input terminal connected to an output terminal of said first logic device and an output terminal connected to the input terminal of said first logic device.

13. A digital/analog conversion apparatus with a color palette RAM for a multimedia, as set forth in claim 11, wherein each of said first to third switching means comprises unit switching circuits of the same number as that of bits of the inputted information, each of said unit switching circuits includes:

a first PMOS transistor having a source for inputting a first input signal and a gate for inputting a corresponding one of the external first to third control signals;

a first NMOS transistor having a drain for inputting a second input signal and a gate for inputting the corresponding control signal;

a second NMOS transistor having a drain connected to the source of said first PMOS transistor to input the first input signal and a source connected to a drain of said first PMOS transistor;

a second PMOS transistor having a source connected to the drain of said first NMOS transistor to input the second input signal and a drain connected to a source of said first NMOS transistor;

a first logic device having an input terminal connected commonly to a common connection point of the drain of said first PMOS transistor and the source of said second NMOS transistor and a common connection point of the source of said first NMOS transistor and the drain of said second PMOS transistor, said first logic device transferring one of the first and second input signals selected by switching operations of said first and second PMOS and NMOS transistors to an output terminal of each unit switching circuit; and a second logic device for inverting the corresponding control signal and applying the inverted control signal to gates of said second PMOS and NMOS transistors.

14. A digital/analog conversion apparatus with a color palette RAM for a multimedia, as set forth in claim 11, wherein each of said first to third switching means comprises unit switching circuits of the same number as that of bits of the inputted information, each of said unit switching circuits includes:

a first NMOS transistor having a gate for inputting a corresponding one of the external first to third control signals and a drain connected to a power supply line;

a first PMOS transistor having a gate for inputting the corresponding control signal and a source connected to the power supply line;

a second NMOS transistor having a drain connected to a source of said first NMOS transistor, a source connected to a ground line and a gate connected to a drain of said first PMOS transistor;

a third NMOS transistor having a drain connected to the drain of said first PMOS transistor, a source connected to the ground line and a gate connected to the source of said first NMOS transistor;

a second PMOS transistor having a source connected to the drain of said first NMOS transistor, a drain connected to the source of said first NMOS transistor and a gate connected to the gate of said second NMOS transistor;

a third PMOS transistor having a source for inputting a first input signal and a gate connected to a common connection point of the source of said first NMOS transistor, the drain of said second NMOS transistor and the drain of said second PMOS transistor;

a fourth NMOS transistor having a drain connected to the source of said third PMOS transistor to input the first input signal, a gate connected to a common connection point of the drain of said first PMOS transistor and the drain of said third NMOS transistor and a source connected to a drain of said third PMOS transistor;

a fifth NMOS transistor having a drain for inputting a second input signal and a gate connected to the common connection point of the source of said first NMOS transistor, the drain of said second NMOS transistor and the drain of said second PMOS transistor;

a fourth PMOS transistor having a source connected to the drain of said fifth NMOS transistor to input the second input signal, a gate connected to the common connection point of the drain of said first PMOS transistor and the drain of said third NMOS transistor and a drain connected to a source of said fifth NMOS transistor; and a logic device having an input terminal connected commonly to a common connection point of the drain of said third PMOS transistor and the source of said fourth NMOS transistor and a common connection point of the source of said fifth NMOS transistor and the drain of said fourth PMOS transistor, said logic device transferring one of the first and second input signals selected by switching operations of said third and fourth PMOS transistors and said fourth and fifth NMOS transistors to an output terminal of each unit switching circuit.

15. A digital/analog conversion apparatus with a color palette RAM for a multimedia, ass set forth in claim 11, wherein each of said first to third switching means comprises unit switching circuits of the same number as that of bits of the inputted information, each of said unit switching circuits includes:

a first NMOS transistor having a gate for inputting a corresponding one of the external first to third control signals and a drain connected to a power supply line;

a first PMOS transistor having a drain gate for inputting the corresponding control signal and a source connected to the power supply line;

a second NMOS transistor having a drain connected to a source of said first NMOS transistor, a source connected to a ground line and a gate connected to a drain of said first PMOS transistor;

a third NMOS transistor having a drain connected to the drain of said first PMOS transistor, a source connected to the ground line and a gate connected to the source of said first NMOS transistor;

a second PMOS transistor having a source connected to the drain of said first NMOS transistor, a drain connected to the source of said first NMOS transistor and a gate connected to the gate of said second NMOS transistor;

a fourth NMOS transistor having a drain connected to the drain of said third NMOS transistor, a source connected to the source of said third NMOS transistor and a gate for inputting the corresponding control signal;

a third PMOS transistor having a source for inputting a first input signal and a gate connected to a common connection point of the source of said first NMOS transistor, the drain of said second NMOS transistor and the drain of said second PMOS transistor;

a fifth NMOS transistor having a drain connected to the source of said third PMOS transistor to input the first input signal, a gate connected to a common connection point of the drain of said first PMOS transistor, the drain of said third NMOS transistor and the drain of said fourth NMOS transistor and a source connected to a drain of said third PMOS transistor;

a sixth NMOS transistor having a drain for inputting a second input signal and a gate connected to the common connection point of the source of said first NMOS transistor, the drain of said second NMOS transistor and the drain of said second PMOS transistor;

a fourth PMOS transistor having a source connected to the drain of said sixth NMOS transistor to input the second input signal, a gate connected to the common connection point of the drain of said first PMOS transistor, the drain of said third NMOS transistor and the drain of said fourth NMOS transistor and a drain connected to a source of said sixth NMOS transistor; and a logic device having an input terminal connected commonly to a common connection point of the drain of said third PMOS transistor and the source of said fifth NMOS transistor and a common connection point of the source of said sixth NMOS transistor and the drain of said fourth PMOS transistor, said logic device transferring one of the first and second input signals selected by switching operations of said third and fourth PMOS transistors and said fifth and sixth NMOS transistors to an output terminal of each unit switching circuit.

16. A digital/analog conversion apparatus with a color palette RAM for a multimedia, as set forth in claim 11, wherein the first to third control signals are applied from the outside of the apparatus, respectively, to said first to third switching means asynchronously with a pixel clock which is an operating basis of the apparatus.

17. A digital/analog conversion apparatus with a color palette RAM for a multimedia, as set forth in claim 10, further comprising:

pipelined time delay means connected between the independent input terminal and said first switching means for matching an arrival time of the digital color information from the independent input terminal to said first switching means with that of the output information from said color palette RAM to said first switching means.

18. A digital/analog conversion apparatus with a color palette RAM for a multimedia, comprising first latch means for inputting a pixel address signal from a display control circuit, a pixel mask register for selectively masking the pixel address signal from said first latch means in response to the control signal from said microprocessor interface means, said color palette RAM for storing the digital color information from said microprocessor interface means in its location corresponding to the address signal from said microprocessor interface means and outputting the digital color information stored in its location corresponding to the pixel address signal from said pixel mask register, second latch means for storing the digital color information from said color palette RAM or different digital color information temporarily, and first to third digital/analog conversion means for converting the digital color information from said second latch means into analog R, G and B color information, wherein the improvement comprises:

first switching means for inputting the digital color information from said color palette RAM at its one input terminal and digital video color information which is directly applied from an external video medium through an independent input terminal of the apparatus at its other input terminal, selecting one of the inputted information in response to an external first control signal and outputting the selected information to said second latch means a color information input line for applying external digital color information directly to said first latch means and second switching means for inputting the digital color information from said color palette RAM at its one input terminal and the external digital color information from said first latch means at its other input terminal, selecting one of the inputted information in response to an external second control signal and outputting the selected information to the input terminal of said first switching means inputting the digital color information from said color palette RAM.

19. A digital/analog conversion apparatus with a color palette RAM for a multimedia, as set forth in claim 18, further comprising:

pipelined time delay means connected between said first latch means and said second switching means for matching an arrival time of the external digital color information from said first latch means to said second switching means with that of the digital color information from said color palette RAM to said second switching means, wherein the digital color information is in response to an input of said pixel address signal.

20. A digital/analog conversion apparatus with a color palette RAM for a multimedia, as set forth in claim 18, further comprising:

pipelined time delay means connected between the independent input terminal and said first switching means for matching an arrival time of the digital color information from the independent input terminal to said first switching means with that of the output information from said color palette RAM to said first switching means.

* * * * *